United States Patent

Hoogmartens et al.

[11] Patent Number: 5,922,506
[45] Date of Patent: Jul. 13, 1999

[54] IMAGING ELEMENT COMPRISING A HYDROPHOBIC PHOTOPOLYMERIZABLE COMPOSITION AND METHOD FOR PRODUCING LITHOGRAPHIC PLATES THEREWITH

[75] Inventors: Yvan Hoogmartens, Wilrijk; Marc Van Damme, Heverlee; Joan Vermeersch, Deinze; Yves Verburgh, Puurs, all of Belgium

[73] Assignee: Agfa-Gevaert, N.V., Mortsel, Belgium

[21] Appl. No.: 08/539,960

[22] Filed: Oct. 6, 1995

[30] Foreign Application Priority Data

Oct. 20, 1994 [EP] European Pat. Off. .............. 94203045

[51] Int. Cl.$^6$ .............................. G03C 1/76; G03F 7/033; G03F 7/26
[52] U.S. Cl. ........................ 430/273.1; 430/260; 430/262; 430/263; 430/272.1; 430/278.1; 430/302
[58] Field of Search ............................... 430/273.1, 278.1, 430/260, 262, 263, 272.1, 302

[56] References Cited

U.S. PATENT DOCUMENTS

| | | | |
|---|---|---|---|
| 4,886,731 | 12/1989 | Sypek et al. | 430/278.1 |
| 5,258,263 | 11/1993 | Cheema et al. | 430/302 |
| 5,368,974 | 11/1994 | Walls et al. | 430/160 |
| 5,462,833 | 10/1995 | Hauquier et al. | 430/159 |
| 5,550,002 | 8/1996 | Kojima et al. | 430/260 |
| 5,565,303 | 10/1996 | Shaw et al. | 430/302 |

FOREIGN PATENT DOCUMENTS 0 259 853  3/1988  European Pat. Off. .
0 260 590  3/1988  European Pat. Off. .

*Primary Examiner*—John S. Chu
*Attorney, Agent, or Firm*—Breiner & Breiner

[57] ABSTRACT

The present invention provides a negative-working photosensitive imaging element comprising on a hydrophilic surface of a support in the order given (i) a hydrophobic photopolymerizable composition capable of being irradiated with actinic light through the support and/or through the front and containing at least one unsaturated compound with at least one polymerizable ethylenically unsaturated group, at least one hydrophobic thermoplastic polymer and at least one photoinitiator, and (ii) optionally a receptor layer, characterized in that said hydrophobic photopolymerizable composition comprises in the order given (i) a polymerizable layer contiguous to said hydrophilic surface and comprising at least part of said at least one unsaturated compound and (ii) a hydrophobic photosensitive layer contiguous to said polymerizable layer comprising at least part of said at least one hydrophobic thermoplastic polymer and of said at least one photoinitiator.

The present invention also provides a method for obtaining a lithographic plate of high quality with said imaging element.

8 Claims, No Drawings

IMAGING ELEMENT COMPRISING A HYDROPHOBIC PHOTOPOLYMERIZABLE COMPOSITION AND METHOD FOR PRODUCING LITHOGRAPHIC PLATES THEREWITH

DESCRIPTION

1. Field of the Invention

The present invention relates to a photosensitive imaging element comprising a photopolymerisable composition and to a method for the formation of lithographic printing plates therewith.

2. Background of the Invention

The use of photosensitive imaging elements comprising photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc. . . . The thus produced differences may be subsequently employed in a developing step to produce a visible image and/or master for printing e.g. a lithographic or electrostatic printing master.

A difference in solubility between the exposed and non-exposed parts of the photopolymerizable composition is often used for the production of lithographic printing plates where a hydrophilic base is coated with the photopolymerizable composition, subsequently exposed and developed using a solvent to remove the non-exposed or insufficiently exposed parts. Such a process is for example described in "Unconventional imaging processes" by E. Brinckman, G. Delzenne, A. Poot and J. Willems, Focal Press London-New York, first edition 1978, pages 33 to 39.

The use of the difference in tackiness to obtain an image is described in e.g. U.S. Pat. Nos. 3,060,024, 3,085,488.and 3,649,268. According to the method disclosed, in these U.S. patents the image-wise exposed photopolymerizable composition looses its tackiness in the exposed parts while the non-exposed parts keep their tackiness. The non-exposed parts can therefore be colored with dry dye pigments to make the image visible.

U.S. Pat. No. 3,060,023 discloses a process for reproducing an image from a photopolymerizable element comprising a support bearing a photopolymerizable layer comprising (a) a thermoplastic polymer, (b) a compound containing at least one terminal ethylenic group by exposing said photopolymerizable element imagewise to actinic radiation, bringing the surface of the exposed layer into contact with the surface of an image-receptive support, heating at least one of the contacting surfaces and separating the two surfaces whereby an image corresponding to the underexposed image areas is transferred to the surface of the image-receptive support, characterized by having in intimate contact with said photopolymerizable layer, at least during exposure, a removable cover sheet, and removing the cover sheet prior to transfer of the underexposed image areas to the surface of the image-receptive support.

U.S. Pat. No. 3,342,593 discloses a process for image production which comprises (A) exposing a photopolymerizable element having a stick temperature above 40° C. and below 220° C. imagewise, said photopolymerizable element having a support bearing a photopolymerizable layer comprising (1) an compound containing at least one terminal ethylenic group, (2) an initiator and (B) pre-heating said exposed element to a temperature above 35° C. but below the stick temperature of the underexposed areas and (C) heating said exposed element to a temperature above said stick temperature and (D) transferring the unexposed polymer to a receptor.

U.S. Pat. No. 3,622,320 discloses imaging elements containing photocrosslinkable polyesters for use in heat transfer processes for making images or for making a lithographic printing plate.

U.S. Pat. No. 3,615,435 discloses an element for image reproduction comprising (1) a support, and bearing on a surface thereof, in order, (2) an unexposed layer of clear photohardenable material which exhibits an increase in stick temperature upon exposure to actinic radiation, and (3) an unexposed contiguous layer of photohardenable material containing a colorant.

GB 1,530,410 discloses a light-sensitive planographic printing plate material comprising (a) a support the surface of which is anodically oxidized aluminium or aluminium alloy, (b) a layer consisting of a hydrophillic organic polymer, (c) at least one layer of a light-sensitive composition and (d) a transparent cover film, arranged on said oxidized surface of the support in this order, the light-sensitive composition having the property that after the material has been imagewise exposed to light there is a difference in the adhesivity to polymer layer (b) and said transparent cover film between exposed areas and unexposed areas of said light-sensitive composition (c), the areas of greater adhesivity to said transparent cover film of said light-sensitive composition layer are peeled off together with said transparent cover film and the areas of greater adhesivity to said polymer layer (b) are left thereon, whereby an image is formed supported on the support.

EP-A 40.424 discloses a negative-working dry peel apart photopolymerizable element consisting essentially of a hydrophobic support, a cover sheet and therebetween a layer of photopolymerizable composition consisting, essentially of (1) at least two halogen-free polymeric organic binders, (2) an initiator system, and (3) a monomer having at least one terminal ethylenic group, the monomer being present in a quantity in excess of the absorptive capacity of the binders for the monomer so that a thin layer of substantially free monomer is present at the interface between the photopolymerizable layer and the cover sheet, the adhesion of the polymerizable layer to the cover sheet being greater before polymerization than it is to the support.

WO-A 9305446 discloses a planographic printing plate comprising, in order, (1) a printing plate substrate, (2) a polymeric photosensitive hydrophilic layer comprising a hydrophilic macromolecular organic binder and a photopolymerizable compound capable of promoting insolubilization in areas of photoexposure and (2) a polymeric photosensitive hydrophobic layer comprising a hydrophobic macromolecular organic binder and a photopolymerizable compound capable of promoting insolubilization in areas of photoexposure; photoexposed areas of each of said photosensitive hydrophilic or hydrophobic layers respectively being photoinsolubilized; non-exposed areas of said photosensitive hydrophobic layer being adapted, upon their removal from said underlyingpolymeric hydrophilic layer after said photoexposure, to the baring of corresponding underlying areas of said polymeric hydrophilic layer.

EP-A 568.744 discloses a method for producing a lithographic printing plate which comprises: (i) providing an uncoated lithographic substrate, (ii) coating a photosensitive layer on one side of the lithographic substrate, (iii) providing a flexible substrate, (iv) coating an adhesive layer directly on the flexible substrate, (v) laminating the coated lithographic substrate to the coated flexible substrate, (vi) imagewise exposing the laminated element of (v) to radiation to which the photosensitive layer is sensitive and (vii) peeling off the flexible substrate along with the nonimage areas of the photosensitive layer.

As illustrated above photopolymerization can be used in a variety of methods to reproduce images. Among these methods several are using dry-developing steps e.g. heating for producing the image which is convenient and offers an ecological advantage. However the quality of the lithographic plate obtainable with photopolymerizable compositions using a dry-developing step, e.g. a thermal transfer step, is rather low due to pinholes in the printing areas and imaging spots (staining) in the non-printing areas. This is partly caused by delamination faults resulting from the inclusion of dust particles between the layer containing the photopolymerizable composition and the base layer and/or the receptor layer before and/or during the exposure and the development of the imaging element, resulting in incomplete patternwise transfer of the photosensitive layer upon heating to the receptor sheet. Several dry-developing photopolymerizable compositions are provided with a cover sheet avoiding more or less said dust inclusion problem. However the quality of the lithographic plate obtainable with said photopolymerizable compositions still needs improvement i.e. less staining a higher resolving power, etc.
. . .

3. SUMMARY OF THE INVENTION

It is an object of the present invention to provide a photosensitive imaging element comprising a photopolymerisable composition said imaging element being developable after exposure by using heat and/or pressure.

It is another object of the present invention to provide a method for obtaining a negative working lithographic printing plate of a high quality using said imaging element.

Further objects of the present invention will become clear from the description hereinafter.

According to the present invention a negative-working photosensitive imaging element is provided comprising on a hydrophilic surface of a support in the order given (i) a hydrophobic photopolymerizable composition capable of being irradiated with actinic light through the support and/or through the front and containing at least one unsaturated compound with at least one polymerizable ethylenically unsaturated group, at least one hydrophobic thermoplastic polymer and at least one photoinitiator, and (ii) optionally a receptor layer, characterized in that said hydrophobic photopolymerizable composition comprises in the order given (i) a polymerizable layer contiguous to said hydrophilic surface and comprising at least part of said at least one unsaturated compound and (ii) a hydrophobic photosensitive layer contiguous to said polymerizable layer comprising at least part of said at least one1hydrophobic1thermoplastic polymer1and of said at least one photoinitiator and the peeling force of said photopolymerisable composition ranges from 0.1 N/m to 12 N/m.

According to the present invention there is also provided a method for obtaining a lithographic printing plate comprising the steps of:

(a) image-wise or information-wise exposing a photosensitive imaging element according to the present invention, (b) laminating before or after said exposure the upper non-receptor layer of said imaging element to a receptor layer, said layer being capable of adhering to said upper non-receptor layer and (c) delaminating the receptor layer from the hydrophilic surface of the support thus transferring the underexposed areas of said hydrophobic polymerizable layer and said hydrophobic photosensitive layer to the receptor layer.

4. DETAILED DESCRIPTION OF THE INVENTION

It has been found that negative working lithographic printing plates of high quality can be obtained according to the method of the present invention using an imaging element comprising on a hydrophilic surface of a support a polymerizable layer comprising one or more unsaturated compound(s) and a hydrophobic photosensitive layer. More precisely it has been found that said printing plates are substantially free of staining in the non-printing areas and have a high resolving power.

According to the present invention said hydrophobic photopolymerizable composition comprises preferably one or more monomers with at least one polymerizable ethylenically unsaturated group. Said monomer can be a monomer having one polymerizable ethylenically unsaturated group. Monomers containing at least two polymerizable ethylenically unsaturated groups are more preferably used. Particularly preferred are urethane type monomers, such as those of table I and those disclosed in EP-A 502562 and unsaturated esters of polyols, especially esters of polyols and an alpha-methylene carboxylic acid.

Examples of urethane type monomers are given in table I.

TABLE I

1.
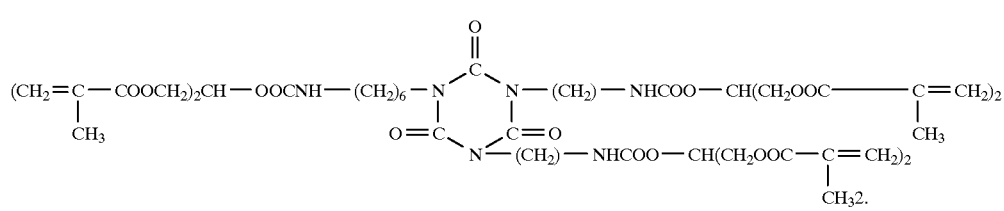

TABLE I-continued

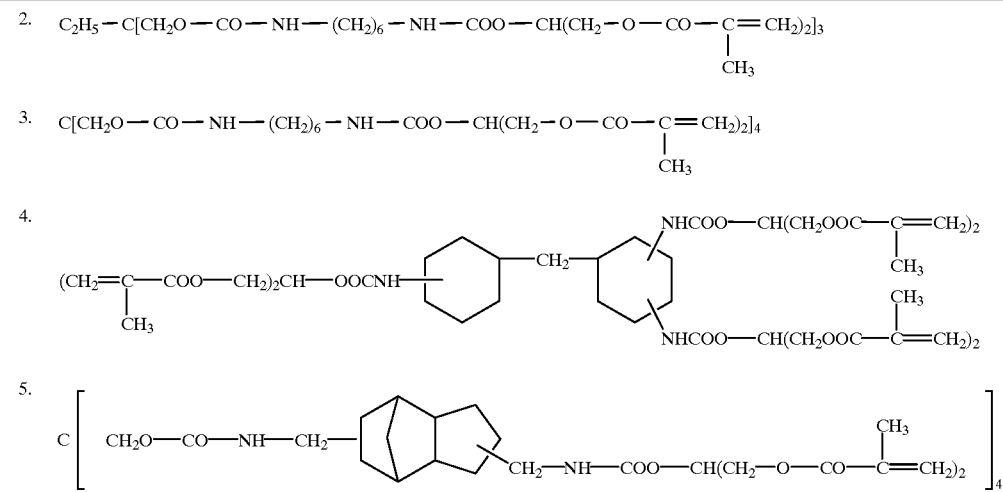

Examples of esters of a polyol and an alpha-methylene carboxylic acid are: ethylene diacrylate, glycerol tri(meth) acrylate, ethylene dimethacrylate, 1.3-propanediol di(meth) acrylate, 1,2,4-butanetriol tri(meth)acrylate, 1,4-cyclohexanediol di(meth)acrylate, 1,4-benzenediol di(meth)acrylate, pentaerythritol tetra(meth)acrylate, dipentaerythritol pentaacrylate, 1,5-pentanediol di(meth)acrylate, the bis acrylates and methacrylates of polyethylene glycols of molecular weight 200–500, and the like.

Other types of monomers suitable for use in the hydrophobic photopolymerizable composition in accordance with the present invention are e.g. the monomers disclosed in EP-A 502562, DEOS no. 4,109,239, 4,005,231, 3,643,216, 3,625,203, 3,516,257, 3,516,256 and 3,632,657, which therefor are incorporated herein by referenre. Further types of monomers suitable for use in the hydrophobic photopolymerizable composition in accordance with the present invention are disclosed in EP-A 522,616. It will be clear that these monomers can be used in admixture.

In stead of or in combination with said monomers with at least one polymerizable ethylenically unsaturated group a prepolymer with at least one polymerizable ethylenically unsaturated group, preferably with two or more polymerizable ethylenically unsaturated groups can be used. Preferably, said prepolymer has a numerical average molecular weight of not more than 25,000, more preferably of not more than 10,000.

According to the present invention thermal polymerization inhibitors may be added to the hydrophobic photopolymerizable composition. Examples of inhibitors for use in accordance with the present invention are disclosed in EP-A 522,616 which therefor is incorporated herein by reference.

Suitable hydrophobic thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose-acetate succinate and cellulose acetate butyrate, cellulose-nitrate;

(I) Polyvinyl esters, e.g. polyvinyl acetate/acrylate, polyvinyl acetate/methacrylate and polyvinyl acetate;

(J) Polyacrylate and alpha-alkyl polyacrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alkohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

Preferably, the hydrophobic thermoplastic polymers used in connection with the present invention are copolymers of styrene, more preferably copolymers of styrene and (meth) acrylates, most preferably copolymers of styrene and butyl methacrylate.

The photosensitive imaging element in accordance with the present invention also comprises at least one photoinitiator, which can be a single compound or a composition. Preferred photoinitiators are polymerization initiators activatable by actinic light and inactive at and below the storing conditions of the photosensitive material. Examples of such initiators are disclosed in EP-A 522,616 which therefor is incorporated herein by reference. A particularly preferred photoinitiator for use in the present invention is a composition comprising a hexaarylbisimidazole, a tetraalkyldiaminobenzophenone e.g. Michler's ketone and a chain transfer agent (also called a hydrogen donor) e.g. 2-mercaptobenzoxazole as disclosed in EP-A 437,259. Other particularly preferred photoinitiators for use in the present invention are triazine compounds substituted with at least one methyl group containing at least one halide atom.

Said photoinitiator(s) is present at least partially in the hydrophobic photosensitive layer, but can also be partially comprised in the hydrophobic polymerizable layer. Preferably said photoinitiator is completely comprised in the hydrophobic photosensitive layer.

To the hydrophobic photopolymerizable composition there can also be added non-thermoplastic polymeric compounds to give certain desirable characteristics, e.g. to improve adhesion to said hydrophilic surface of the support, wear properties, chemical inertness, etc. Suitable non-thermoplastic polymeric compounds include cellulose, phenolic resins and melamine-formaldehyde resins, etc. If desired, the hydrophobic photopolymerizable composition can also contain immiscible polymeric or non-polymeric organic or inorganic fillers or reinforcing agents which are essentially transparent at the wave-lengths used for the exposure of the photosensitive imaging element, e.g. organophilic silicas, bentonites, silica, powdered glass, colloidal carbon, as well as various types of dyes and pigments in amounts varying with the desired properties of the hydrophobic photopolymerizable composition. The fillers are useful in improving the strength of the composition, reducing tack and in addition, as coloring agents.

Agents to improve the wetting and/or adjust the adhesion of the photopolymerizable composition may be added. Suitable agents are e.g. silicons, silicon containing polymers e.g. a poly(dimethylsiloxane)-polyether copolymer, poly (dimethylsiloxane)-polyester, silicon containing surfactants, fluor containing copolymers and fluor containing surfactants etc. . . .

Various dyes, pigments, thermographic compounds, UV-absorbers, anti-oxidants and color forming components as disclosed in EP-A 522,616 can be added to the photopolymerizable composition to give a variety of images after the processing. These additive materials should however preferably not absorb excessive amounts of light at the exposure wavelength or inhibit the polymerization reaction.

Said photopolymerizable composition is preferably solid at temperatures below 40° C. and provides, after image-wise exposure, unexposed parts which are transferable at temperatures between 40° C. and 250° C.

The force, needed to peel away the photopolymerizable composition from the support is called the peeling force of the photopolymerizable composition. Said peeling force is mainly a function of the nature of the used monomers, polymers and their relative amounts in the photopolymerizable composition and of the nature of the hydrophilic surface of the support.

Said peeling force is measured with a tensile strength tester Instron M/C 1122 serial H 1882. The photopolymerizable composition, coated on the hydrophilic support is, if not comprising a laminated receptor layer of at least 63 $\mu$m thick laminated against a 6 $\mu$m thick layer consisting of Baystal P 2000, coated on a subbed polyethylene terephthalate support (having an upper subbing layer contg. gelatine and silica) of 100 $\mu$m, being then the receptor layer. The lamination is effected by means of a Codor lamipacker LPA 330 at 90° C. and 300 mm/min.

The peel test occurs at 25° C. and 50% relative humidity over a guide roller with a diameter of 13 mm and a weight of 75 g with a peel angle of 1800. The support of the imaging element is fixed so that it remains planar during the whole measurement. Said Instron is calibrated at 0 after the guide roller is put in place in a fold of the receptor layer. The receptor layer is then peeled away at a speed of 1 m/min, adjusted on said Instron for a peel of 180°. The necessary force for said peeling, as indicated by said Instron is noted; the numerical average of the result of 3 measurements is taken as the peeling force of the photopolymerizable composition.

The peeling force of the photopolymerizable composition ranges preferably from 0.2 N/m to 10 N/m, more preferably from 0.5 N/m to 6 N/m.

A photopolymerizable composition having the above mentionned peeling forces can be easily prepared by one skilled in the art by making a few experiments, changing the monomer and/or the thermoplastic polymer and/or their relative weight in said composition and/or by changing the hydrophilic substrate of the support.

The presence in an imaging element of a polymerizable layer contiguous to the hydrophilic surface of the support can be demonstrated by peeling apart the photopolymerizable composition from the hydrophilic surface of the support and examining said freed hydrophilic surface with ESCA or TOF-SIMS for the presence of signals, resulting from monomer comprised in the polymerizable layer.

The polymerizable layer comprises at least one monomer with at least one polymerizable ethylenically unsaturated group. When said monomers are used in admixture, the polymerizable layer preferably comprises at least a part of all used monomers. The dry thickness of said layer lies preferably in a range from 0.01 $g/m^2$ to 1.00 $g/m^2$, more preferably in a range from 0.02 $g/m^2$ to 0.25 $g/m^2$.

To the polymerizable layer there can also be added thermoplastic polymer compounds, preferably those described above, but in an amount that the above mentionned peeling force ranges are respected. There can also be added other compounds to said layer to give certain desirable characteristics, e.g. to improve adhesion to said hydrophilic surface of the support used in accordance with the present invention.

According to a preferred mode of the present invention said hydrophobic photosensitive layer comprises for at least 25 %, more preferably for at least 50 % by weight one or more thermoplastic polymers. In addition, the hydrophobic photosensitive layer may contain one or more unsaturated compounds but preferably for less than 50 % by weight. Said layer is coated in a range from 0.30 $g/m^2$ to 6.00 $g/m^2$, preferably in a range from 1.00 $g/m^2$ to 2.50 $g/m^2$.

The support of the imaging element according to the present invention has a hydrophilic surface and should be stable at the processing conditions.

Said hydrophilic base may be a hydrophilic metallic support e.g. an aluminium support.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 μm, an anodization layer with a thickness between 0.4 and 2.0 μm and is sealed with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred-because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$. $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/$dm^2$ is employed for 5–240 seconds. The temperature of the electrolytic graining solution may vary from 5–50° C. Electrochemical graining is carried out preferably with an alternating current from 10 Hz to 300 Hz.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70 % by weight can be used within a temperature range from 0–70° C. The anodic current density may vary from 1–50 A/$dm^2$ and a voltage within the range 1–100 V to obtain an anodized film weight of 1–8 g/$m^2$ $Al_2O_3.H_2$). The anodized aluminum foil may subsequently be rinsed with demineralised water within a temperature range of 10–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described-in JA-Pu-58-14,797.

More preferably, said support with a hydrophilic surface comprises a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.1 and 5 as disclosed in e.g. GB-P 1,419,512, FR-P 2,300,354, U.S. Pat. Nos. 3,971,660, 4,284,705, EP-A 405,016 and EP-A 450,199.

A particularly suitable hydrophilic layer is a layer of polyvinyl alcohol hardened with tetramethylorthosilicate or tetraethylorthosilicate containing $TiO_2$ wherein the weight ratio between said polyvinylalcohol and said tetramethylorthosilicate or tetraethylorthosilicate is between 0.8 and 2 and wherein the weight ratio between said polyvinylalcohol and said titaniumdioxide is preferably not higher than 1.

The above mentioned flexible supports may be opaque or transparent, e.g. a paper support or resin support. When a paper support is used preference is given to one coated at one or both sides with an Alpha-olefin polymer, e.g. a polyethylene layer which optionally contains an antihalation dye or pigment. It is also possible to use an organic resin support e.g. cellulose esters such as cellulose acetate, cellulose propionate and cellulose butyrate; polyesters such as poly(ethylene terephthalate); polyvinyl acetals, polystyrene, pglycarbonates; polyvinylchloride or poly-Alpha-olefins such as polyethylene or polypropylene.

One or more subbing layers may be coated between the flexible hydrophobic support and the hydrophilic layer for use in accordance with the present invention in order to get an improved adhesion between these two layers.

A preferred subbing layer for use in connection with the present invention, is a subbing layer which is contiguous to the hydrophilic layer and contains gelatin and silica.

The imaging element may comprise a temporary protective layer on top of the photosensitive layer, preferably a cellulose triacetate or polyethylene terephtalate film base coated with a hydrophilic release layer e.g. polyvinyl alcohol. Said temporary layer should be removed before or after the photo-exposure step but before the processing steps.

Preferably, the photosensitive imaging element comprises on top of the photosensitive layer one or more protective layers selected from the group consisting of (i) a transfer layer which is capable of adhering to the underlying contiguous layer and to a receptor layer and (ii) a receptor layer which is capable of adhering to the underlying contiguous layer and which is upperlying said transfer layer if the latter is present.

Said receptor layer is preferably stable at the processing conditions. The particular layer used is dependent on the nature of the composition of the imaging element. Suitable receptor layers include paper; cardboard; metal sheets; foils and meshes e.g. aluminium, copper, steel, bronze etc.; transparent organic resins e.g. cellulose esters such as cellulose acetate, cellulose propionate and cellulose butyrate, polyvinyl acetals, polystyrene, polycarbonate or polyvinylchloride; opaque foamed or pigmented polyester; silk; cotton and viscose rayon fabrics or screens. Preferred receptor layers are commercially available paper brands as disclosed in EP-A 93201858.3 which therefor is incorporated herein by reference and films or coatings of polyesters such as polyethylene terephthalate or of poly-Alpha-olefins such as polyethylene or polypropylene. When said receptor layer is the only protective layer in said imaging element, paper or a poly-Alpha-olefin coated paper is preferably used.

Optionally, a receptor layer is part of a receptor element. A receptor element for use in accordance with the invention comprises at least a receptor layer as an outside layer.

In one embodiment, said receptor element comprises as the receptor layer one of the receptor layers mentioned before and further a thin additional layer. Examples are supports provided with a thin metal layer e.g. polyester supports provided with a vapour deposited metal layer and most useful polyethylene coated paper. Said receptor element may also comprise (a) additional layer(s) such as (a) backing layer(s).

In another, preferred embodiment, said receptor element comprises as the receptor layer an adhesive layer applied on a flexible support. Suitable adhesive layers are described hereinafter; flexible supports are described hereinbefore. Said adhesive layer may also be a subbing layer, e.g. on a polyester such as polyethylene terephthalate.

A transfer layer, which is capable of adhering to a receptor layer may be a thermo-adhesive layer or a pressure-adhesive layer.

Suitable thermo-adhesive layers (TALs) for use in the present invention may have a glas transition temperature Tg between 10° C. and 100° C. as measured with the 1090 THERMOANALYZER of Du Pont Co. During the lamination and delamination step a minimal thermal load should be imposed to the material in order to save energy and diminish the risk for material change or deformation. For these reasons the T of the TAL is preferably below 60° C. The $T_g$ value of the TAL can be determined by the $T_g$ value of the polymer(s) used and/or by the addition of polymeric or low-molecular plasticizers or thermosolvents.

The adherance of the TAL to the receptor layer is also determined by the flow properties of the TAL while heating above the Tg. A parameter for describing this property is the melt viscosity. Preferably a TAL for use in accordance with the present invention has a melt viscosity of more than 3000 Poise measured at 120° C. with the VISCOELASTIC MELT TESTER of Rheometrics Co, Surrey, UK.

In order to induce easy film formation without unwanted sticking of the TAL to the backside of the imaging medium or to other materials a TAL is preferably used with a $T_g$ value between 20° C. and 45° C., a melt viscosity greater than 7000 Poise and an elasticity corresponding to a tg $\delta^{-1}$ value greater than 1.30 measured at 120° C. with the VISCOELASTIC MELT TESTER of Rheometrics Co, Surrey, UK. The tg $\delta^{-1}$ value is a measure for the elasticity as described in "Polymer Chemistry : the Basic Concept" by P. C. Hiemenz, 1984, edit. by M. Dekker Inc., New York.

For ecological and practical reasons the TAL is preferably coated from an aqueous medium. Therefore the polymers are preferably incorporated as latices.

Preferred latices are latices of styrene, styrene-butadiene, styrene-(meth)acrylate and n.butylacrylate-methylmethacrylate-acrylonitrile. These latices can contain other comonomers which improve the stablitity of the latex, such as acrylic acid, methacrylic acid and acrylamide. Other possible latices are disclosed in EP-A 92203188.3, which therefor is incorporated herein by reference.

Particularly suitable polymers for use in the TAL layer are the BAYSTAL polymer types, marketed by Bayer AG, Germany, which are on the basis of styrene-butadiene copolymers with a weight ratio between 40/60 and 80/20. If desired a few weight % (up to about 10%) of acrylamide and/or acrylic acid can be included. Other useful polymers are the EUDERM polymers, also from Bayer AG, which are copolymers comprising n.-butylacrylate, methylmethacrylate, acrylonitrile and small amounts of methacrylic acid.

Various additives can be present in the TAL to improve the layer formation or the layer properties, e.g. thickening agents, surfactants, levelling agents, thermal solvents and pigments.

Apart from an upper thermo-adhesive layer which should preferably comply with the requirements described above the material can contain one or more supplementary thermo-adhesive layer(s) positioned between the upper TAL and the hydrophobic photosensitive layer e.g. to optimize the adherance to the hydrophobic photosensitive layer in view of obtaining a better image quality after the delamination process. This (these) other TAL(s) can have a composition and/or physical properties different from those imposed to the upper TAL. This (these) layer(s) can contain one polymer or a mixture of polymers, optionally in combination with low-molecular additives like plasticizers or thermosolvents. Other ingredients which can be incorporated include waxes, fillers, polymer beads, glass beads, silica etc.

Suitable pressure-adhesive layers (PALs) for use in the present invention comprise one or more pressure sensitive adhesives. Said pressure sensitive adhesives are preferably tacky elastomers e.g. block copolymers of styrene/isoprene, styrene/butadiene rubbers, butyl rubbers, polymers of isobutylene and silicones. Particularly preferred are natural rubbers and acrylate copolymers as disclosed in U.S. Pat. No. 3,857,731. The used pressure sensitive adhesive preferably has a continuous-coat (100% coverage) peel adhesion value, when applied to untreated paper, between 1 and 10 N/cm width, more preferably between 2 and 7 N/cm width.

The pressure-adhesive layer comprising a pressure sensitive adhesive may contain a binder. Suitable binders for use in combination with the pressure sensitive adhesives are binders that are inert towards the pressure sensitive adhesives i.e. they do not chemically attack the pressure sensitive adhesives or act as a solvent for them. Examples of such binders are nitrocellulose, urethanes, gelatin, polyvinyl alcohol etc. . . .

The amount of binder should be chosen such that the pressure sensitive adhesives are effectively anchored to the hydrophobic photosensitive layer. Preferably the amount of binder is lower than 2.5 parts by weight with respect to the pressure sensitive adhesives and more preferably lower than 0.6.

The pressure-adhesive layer comprising a pressure sensitive adhesive may also contain a tackyfier e.g. rosin soap or a terpene.

The imaging element containing a pressure-adhesive layer comprises preferably also a receptor layer on top of said pressure-adhesive layer. In general said receptor layer is (are) (a) transparent layer(s) contiguous to said pressure-adhesive layer e.g. a transparent organic resin layer.

The thickness of the thermo-adhesive or pressure-adhesive transfer layer is important for the adherence of said layers to the photosensitive layer. Preferably the thickness of said transfer layer lies between 0.1 and 30 μm, more preferably between 1 and 15 μm.

The imaging element in accordance with the present invention may be prepared by coating the layers on each other or by laminating layers or packets of layers to each other.

In a practical embodiment the imaging element is prepared by the following steps:

coating on a support with a hydrophilic surface in accordance with the present invention (i) a polymerizable layer (ii) a hydrophobic photosensitive layer and (iii) a thermo-adhesive layer with optionally an underlying pressure-adhesive layer.

In another practical embodiment the imaging element is prepared by laminating the above described imaging element with its thermo-adhesive layer onto a receptor layer or onto a pressure-adhesive layer coated on a receptor layer.

In still another practical embodiment the imaging element is prepared by the following steps:

coating on a hydrophilic surface of a support in accordance with the present invention a polymerizable layer and a hydrophobic photosensitive layer and laminating the element thus formed with its hydrophobic photosensitive layer onto a receptor layer or onto a pressure-adhesive or thermo-adhesive layer coated on a receptor layer.

It is also possible instead of coating a separate polymerizable layer and hydrophobic photosensitive layer to prepare a hydrophobic photopolymerisable composition which is homogeneous before and while coating said compositions but separates in a polymerizable layer and a hydrophobic photosensitive layer during drying by choosing a suitable solvent in an sufficient amount. Methylethylketone is such a solvent.

According to the method of the present invention for obtaining an image an imaging element according to the present invention is image-wise or information-wise exposed to actinic radiation to harden the hydrophobic polymerizable composition pattern-wise. The exposure can be a contact exposure using e.g ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

Said exposure can be made through the front side or the back side of the imaging element. It goes without saying that for an exposure through the back the support has to be transparent for the radiation used for the exposure of the photoposensitive imaging element where for a front side exposure any protective layer, if presents has to be transparent for said radiation. Preferably the imaging element is exposed through the front side.

Subsequent to the image-wise or information-wise exposure an image is obtained by (i) laminating before or after said exposure the upper non-receptor layer of said imaging element to a receptor layer and (ii) delaminating the receptor layer from the hydrophilic surface of the support thus transferring the underexposed areas of said hydrophobic photopolymerizable composition and the optional upperlying layer(s) to the receptor layer and uncovering the image comprised of the hydrophilic surface of the support and the retained exposed areas of the hydrophobic photopolymerizable composition.

When the imaging element does not comprise a pressure-adhesive layer said laminating is effected by means of a heating step, preferably at a temperature between 40° C. and 180° C., more preferably at a temperature between 65° C. and 120° C. Said heating may be applied to either or both the support and the receptor layer before, while or after bringing the receptor layer in contact with the upper non-receptor layer of the imaging element. A higher temperature results in a higher sensitivity probably due to a better image-wise adherance of the receptor layer to the imaging element.

With an imaging element according to the present invention comprising as a transfer layer in the imaging element a thermo-adhesive layer different kinds of cheap plain paper can be applied as receptor layer. A broad range of commercial papers with diverging physical properties can be used.

When the imaging element comprises a pressure-adhesive layer, said laminating requires a pressure step. Said pressure is applied while the receptor layer is in contact with the upper non-receptor layer of the imaging element.

An imaging element and a receptor layer, optionally a receptor element may be brought in contact before exposure. In such embodiment it is required that either the back of the imaging element and/or preferably the receptor layer or the optional receptor element is transparent for the radiation used for the exposure of the hydrophobic photopolymerizable composition.

An overall exposure, before or after the image-wise exposure can be applied to the imaging element according to the present invention, resulting in a higher sensitivity.

It may be advantageous to overall expose the image to light and/or heat to enhance its stability. Such a procedure is especially preferred when the image is used as a printing master as described below to improve the scratch resistance of the image.

Because the imaging element according to the present invention comprises a hydrophobic photopolymerizable composition on a hydrophilic surface of a support, the obtained image can be used as a negative working lithographic printing plate (i.e. a printing plate giving prints with a reversed image of the original). Transfer of the underexposed areas of the hydrophobic photopolymerizable composition and the optional upperlying layer(s) to a receptor layer and delaminating the receptor layer from the hydrophilic surface of the support will then result in an image-wise differentiation between hydrophilic and hydrophobic parts that can be used to print with an oily or greasy ink, resulting in a negative working printing plate (i.e. a printing plate giving prints with a reversed image of the original). The hydrophobic parts will be capable of accepting lithographic ink, whereas the hydrophilic areas, when moistened with water, will not accept the ink. The areas which accept ink form the printing image areas and the ink-rejecting areas form the background areas.

The following examples illustrate the-present invention without limiting it thereto. All percentages are by weight unless stated otherwise.

EXAMPLE 1

(Example According to the Invention)

Preparation of a Lithographic Base

To 440 g of a dispersion contg. 21.5% of $TiO_2$ (average particle size 0.3–0.5 μm) and 2.5% of polyvinylalcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethylene terephthalate film support having a thickness of 175 μm (having provided thereon a hydrophilic adhesion layer) at a wet coating thickness of 50 g/m2, dried at 30° C. and subsequently hardened by subjecting it to a temperature of 570° C. for 1 week.

Preparation of the Imaging Element
Coating of the hydrophobic polymerizable layer Onto the above obtained lithographic base was coated a solution of 1% by weight of dipentaerythritolpentaacrylate in methylethylketone at a wet coating thickness of 6 μm and dried at 30° C.

Coating of the hydrophobic photosensitive layer onto a temporary support

Onto a polyethylene terephthalate support was coated a photosensitive composition consisting of a solution in methylethylketone of 6.85% by weight of a copolymer styrene/butylmethacrylate (Toner Resin OT 5154 from Degussa), 0.15% by weight of a blue dye (C. I. 61551), 1.33% by weight of bisimidazole, 0.1% by weight of Michler's ketone, and 0.07% by weight of mercaptobenzoxazole at a wet coating thickness of 25 μm.

The obtained element was laminated to the coated lithographic support at a temperature of 90° C. The polyethylene terephthalate foil was stripped-off.

The peeling force of the photopolymerizable composition was 2 N/m.

The above obtained imaging element was overcoated with a solution consisting of a 20% by weight aqueous dispersion of Baystal P 2000 (from Bayer AG, Germany) which is a copolymer containing styrene, butadiene and acrylic acid with a glass transition temperature of 34° C. (measured with the "1090 THERMOANALYZER" of Dupont Co.), a melt viscosity of more than 13420 Poise and an elasticity corresponding to a tg δ$^{-1}$ value of 3.54, both last properties measured at 120° C. (with the "VISCOELASTIC MELT TESTER" of Rheometrics Co, UK) at a wet coating thickness of 30 g/m2.

Preparation and Evaluation of the Lithographic Plate

On top of this imaging element and those described below there was placed a test target with a 60 lines per cm screen as well as fine positive and negative lines and the..imaging element was exposed therethrough to ultraviolet radiation.

Each of the exposed imaging elements was then placed in face-to-face contact with the receptor layer, being a subbed polyethylene terephhalte support (having an upper subbing layer contg. gelatine and silica).

The contacting elements were conveyed through a roll laminator device at 107° C. and at a speed of 0.3 m/min and the elements were peeled apart whereby the non-exposed parts of the photopolymerizable compositions were removed and the exposed areas remained on the lithographic base, thus being a negative working system.

With this sample, a good image was obtained with a line reproduction for lines of 12 μm.

The obtained image on the lithographic base could be used to print on a conventional offset press using a commonly employed ink and fountain. Good copies, free of stain were obtained.

EXAMPLE 2

(Example According to the Invention)

An imaging element was prepared, exposed, laminated and peeled apart similar to the imaging element of example 1 except that the polymerizable layer, coated onto the lithographic base was coated from a solution consisting of 0.85% by weight of dipentaerythritolpentaacrylate, 0.133.% by weight of bisimidazole, 0.01% by weight of Michler's ketone and 0.07% by weight of mercaptobenzoxazole in methylethylketone at a wet coating thickness of 6 μm.

The peeling force of the photopolymerizable composition was 3 N/m.

A good image was obtained with a line reproduction for lines of 12 μm.

The obtained image on the lithographic base could be used to print on a conventional offset press using a commonly employed ink and fountain. Good copies free of stain were obtained with this sample.

EXAMPLE 3

(Comparative Example)

An imaging element was prepared, exposed, laminated and peeled apart similar to the imaging element of example 2 except that the photosensitive layer of example 2 (coated onto the polyethylene terephthalate support) was coated from a solution in methylethylketone containing 8.35% by weight of a copolymer styrene/butylmethacrylate (Toner Resin OT 5145 from Degussa) and 0.15% by weight of a blue dye (C. I. 61551) at a wet coating thickness of 25 μm, no photoinitiator being present in said solution.

The peeling force of the photopolymerizable composition was 3 N/m.

No image was obtained. Also the exposed parts were removed from the lithographic base.

EXAMPLE 4

(Comparative Example)

An imaging element was prepared, exposed, laminated and peeled apart similar to example 3 except that the polymerizable layer is coated from a solution as in example 1.

The peeling force of the photopolymerizable composition was 2 N/m.

No image was obtained. Also the exposed parts were removed from the lithographic base.

EXAMPLE 5

(Example According to the Invention)

An imaging element was prepared, exposed, laminated and peeled apart as in example 1 except that the polymerizable layer (coated onto the lithographic base) was coated from a solution of 0.66% by weight of dipentaerythritolpentaacrylate in methylethylketone at a wet coating thickness of 6 μm.

The peeling force of the photopolymerizable composition was 5 N/m.

A good image was obtained with a line reproduction for lines of 12 μm.

The obtained image on the lithographic base could be used to print on a conventional offset press using a commonly employed ink and fountain. Good copies without stain were obtained with this sample.

EXAMPLE 6

(Comparative Example)

An imaging element was prepared, exposed, laminated and peeled apart similar to example 5 except that the amount of monomer used in the polymerizable layer was added to the photosensitive layer in order to obtain the same amount of all components/m² as in example 5. This means in concreto that no polymerizable layer was coated onto the hydrophilic base, in order to form a photosensitive layer onto a temporary support a polyethylene terephthalate support was coated with a photosensitive composition consisting of a solution in methymethylketone of 6.69% by weight of a copolymer styrene/butylmethacrylate (Toner Resin OT 5154 from Degussa), 0.16% by weight of dipentaerythritolpentaacrylate, 0.15% by weight of a blue dye (C. I. 61551). 1.33% by weight of bisimidazole, 0.1% by weight of Michler's ketone, and 0.07% by weight of mercaptobenzoxazole at a wet coating thickness of 25 µm.

The peeling force of the photopolymerizable composition was 18 N/m.

No image was obtained. The unexposed as well as the exposed areas remained on the lithographic base.

EXAMPLE 7

(Example According to the Invention)

An imaging element according to the invention was prepared as follows. The hydrophilic-base of example 1 was coated by means of a bar coater with a composition consisting of a solution in methylethylketone of 0.75 % by weight of dipentaerythritol pentaacrylate, and 0.25 % by weight of a copolymer of styrene/butylmethacrylate. The mixture was coated to a wet coating thickness of 6 µm.

A photosensitive composition consisting of a solution in methylethylketone of 8.35 % by weight of a copolymer of styrene/butylmethacrylate, 0.15 % by weight of a blue dye (C. I. 61551), 1.33 % by weight of bis-imidazole, 0.1 % by weight of Michler's ketone, and 0.07 % by weight of mercaptobenzoxazole was coated to a polyethylene terephthalate film support having a thickness of 100 µm. The mixture was coated to a dry coating thickness of 2.4 µm.

The peeling force of the photopolymerizable composition was 5 N/m.

The peeling force of the photopolymerizable composition was 18 N/m.

The photosensitive layer was then placed in face-to-face contact with the coated hydrophilic base and laminated thereto by conveying them through a roll laminator device at 90° C. and a speed of 0.3 m/min. Subsequently the temporary support was removed.

The imaging element described above was exposed, laminated and peeled apart similar to example 1. The exposed portions remain on the hydrophilic base thus being a negative working system.

A good image was obtained with a line reproduction for lines of 12 µm.

The obtained image on the lithographic base could be used to print on a conventional offset press using a commonly employed ink and fountain. Good copies without stain were obtained with this sample.

EXAMPLE 8

(Example According to the Invention)

An imaging element according to the invention was prepared as follows. The hydrophilic base of example 1 was coated by means of a bar coater with a composition consisting of a solution in methylethylketone of 0.75 % by weight of dipentaerythritol pentaacrylate. The mixture was coated to a wet coating thickness of 6 µm.

A photosensitive composition consisting of a solution in methylethylketone of 8.46 % by weight of a copolymer of styrene/butylmethacrylate, 1.16 % by weight of dipentaerythritol pentaacrylate, 0.17 % by weight of a blue dye (C. I. 61551), 1.62 % by weight of bis-imidazole, 0.12 % by weight of Michler's ketone, and 0.09 % by weight of mercaptobenzoxazole was coated onto a polyethyleneterephthalate film support having a thickness of 100 µm. The mixture was coated to a dry coating thickness of 2.4 µm.

The peeling force of the photopolymerizable composition was 4 N/m.

The photosensitive layer was then placed in face-to-face contact with the coated hydrophilic base and laminated thereto by conveying them through a roll laminator device at 90° C. and a speed of 0.3 m/min. Subsequently the temporary support was removed.

The imaging element described above was exposed, laminated and peeled apart similar to example 1. The exposed portions remain on the hydrophilic base thus being a negative working system.

A good image was obtained with a line reproduction for lines of 12 µm.

The obtained image on the lithographic base could be used to print on a conventional offset press using a commonly employed ink and fountain. Good copies without stain were obtained with this sample.

EXAMPLE 9

(Comparative Example)

An imaging element was prepared, exposed, laminated and peeled apart similar to the imaging element of example 1 except that the polymerizable layer, coated onto the lithographic base was coated from a solution consisting of 0.40% by weight of dipentaerythritolpentaacrylate at a wet coating thickness of 6 µm.

The peeling force of the photopolymerizable composition was 15 N/m.

No image was obtained. The unexposed as well as the exposed areas remained on the lithographic base.

We claim:

1. A negative-working photosensitive imaging element comprising on a hydrophilic surface of a support which is a hardened hydrophilic layer coated on a flexible support, containing polyvinyl alcohol hardened with hydrolyzed tetraalkyl orthosilicate wherein the weight ratio between said polyvinyl alcohol and said tetraalkyl orthosilicate is between 0.1 and 5 and siliciumoxide and/or titaniumdioxide, in the order given (i) a hydrophobic photopolymerizable composition capable of being irradiated with actinic light through said support and/or through the front and containing at least one unsaturated compound with at least one polymerizable ethylenically unsaturated group, at least one hydrophobic thermoplastic polymer and at least one photoinitiator, said hydrophobic photopolymerizable composition consisting of two hydrophobic layers, and (ii) optionally a receptor layer, wherein said hydrophobic photopolymerizable composition comprises in the order given (a) a hydrophobic polymerizable layer contiguous to said hydrophilic surface and comprising at least part of said at least one unsaturated compound and (b) a hydrophobic photosensitive layer contiguous to said polymerizable layer comprising at least part of said at least one hydrophobic thermoplastic polymer and of said at least one photoinitiator, and the peeling force of the photopolymerizable composition ranges from 0.1 N/m to 12 N/m.

2. A photosensitive imaging element according to claim 1 wherein the dry thickness of said polymerizable layer lies in a range from 0.01 g/m$^2$ to 1.00 g/m$^2$.

3. A photosensitive imaging element according to claim 1 wherein said hydrophobic photosensitive layer comprises for at least 25% by weight one or more thermoplastic polymers.

4. A photosensitive imaging element according to claim 1 wherein said hydrophobic photosensitive layer comprises less than 50% by weight of said at least one unsaturated compound.

5. A photosensitive imaging element according to claim 1 wherein said hydrophobic photosensitive layer is coated in a range from 0.30 g/m$^2$ to 6.00 g/m$^2$.

6. A photosensitive imaging element according to claim 1 wherein said support with a hydrophilic surface is a grained, anodized, and optionally sealed aluminum foil.

7. A negative-working photosensitive imaging element comprising on a hydrophilic surface of a support in the order given (i) a hydrophobic photopolymerizable composition capable of being irradiated with actinic light through said support and/or through the front and containing at least one unsaturated compound with at least one polymerizable ethylenically unsaturated group, at least one hydrophobic thermoplastic polymer and at least one photoinitiator, said hydrophobic photopolymerizable composition consisting of two hydrophobic layers, and (ii) optionally a receptor layer, wherein said hydrophobic photopolymerizable composition comprises in the order given (a) a hydrophobic polymerizable layer contiguous to said hydrophilic surface and comprising at least part of said at least one unsaturated compound and (b) a hydrophobic photosensitive layer contiguous to said polymerizable layer comprising at least part of said at least one hydrophobic thermoplastic polymer and of said at least one photoinitiator, and comprising on top of the photosensitive layer one or more protective layers selected from the group consisting of (c) a transfer layer which is capable of adhering to the underlying contiguous layer and to a receptor layer and (d) a receptor layer which is capable of adhering to the underlying contiguous layer, and which is upperlying said transfer layer if said transfer layer is present, and the peeling force of the photopolymerizable composition ranges from 0.1 N/m to 12 N/m.

8. A method for obtaining a positive working lithographic printing plate comprising the steps of:

(a) image-wise or information-wise exposing a photosensitive imaging element according to claim 1, (b) laminating before or after said exposure the upper non-receptor layer of said imaging element to a receptor layer, said layer being capable of adhering to said upper-non-receptor layer and (c) delaminating the receptor layer from the hydrophilic surface of the support thus transferring the underexposed areas of said hydrophobic photopolymerizable composition and the optional upperlying layer(s) to the receptor layer.

* * * * *